(12) United States Patent
Hutmacher et al.

(10) Patent No.: US 6,842,713 B1
(45) Date of Patent: Jan. 11, 2005

(54) RAPID DIAGNOSTIC MULTI DATA RETRIEVAL APPARATUS AND METHOD FOR USING THE SAME

(75) Inventors: Jeffrey P. Hutmacher, Ridgecrest, CA (US); Bruce Thompson, Ridgecrest, CA (US); Falu Shah-Patel, Ridgecrest, CA (US); Tim Smith, Ridgecrest, CA (US); Tom Dunn, Ridgecrest, CA (US); Anthony Kalomas, Ridgecrest, CA (US); Michael Harker, Ridgecrest, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 27 days.

(21) Appl. No.: 10/371,582

(22) Filed: Feb. 24, 2003

(51) Int. Cl.$^7$ ............................................. G01M 19/00
(52) U.S. Cl. ..................................................... 702/122
(58) Field of Search ........................................ 702/122

(56) References Cited

U.S. PATENT DOCUMENTS

| | | | | |
|---|---|---|---|---|
| 5,206,455 A | * | 4/1993 | Williams et al. ............ 102/201 |
| 5,223,788 A | * | 6/1993 | Andreano et al. ............ 714/25 |
| 5,325,359 A | * | 6/1994 | Jordan et al. ................ 370/463 |
| 5,349,685 A | * | 9/1994 | Houlberg ...................... 712/40 |
| 5,931,877 A | * | 8/1999 | Smith et al. .................. 701/29 |
| 6,219,626 B1 | | 4/2001 | Steinmetz et al. |
| 6,269,319 B1 | * | 7/2001 | Neisch et al. ................ 702/118 |
| 6,529,620 B2 | * | 3/2003 | Thompson .................. 382/141 |

* cited by examiner

Primary Examiner—Joe Barlow
Assistant Examiner—Anthony T. Dougherty
(74) Attorney, Agent, or Firm—Laura R. Foster (57) ABSTRACT

The present invention relates to a novel diagnostic radar data retrieval apparatus and method of using the same. One aspect of the present invention includes a portable unit that extracts and stores radar calibration data from radar specific hardware (via a 1553 communications bus) to a personal computer (PC) for diagnostic purposes. Another aspect of the present invention is a method wherein the calibration data stored in the RCCM device is downloaded to a computer, preferably a PC, with input and display software that receives the data from the RCCM device and processes the radar calibration data into tables for various types of analysis such as, but not limited to, troubleshooting purposes.

49 Claims, 7 Drawing Sheets

RAPID DIAGNOSTIC MULTI DATA RETRIEVAL APPARATUS AND METHOD FOR USING THE SAME

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF THE INVENTION

The present invention relates generally to a rapid diagnostic radar data retrieval apparatus and method of using the same, and more particularly, an apparatus and a method for retrieving diagnostic data from radar systems for rapid on site troubleshooting.

BACKGROUND OF THE INVENTION

In military aircraft there are radar systems that require diagnostics and debugging from time to time to ensure their proper operation. One example is radar used by the F/A-18 military aircraft. In the F/A-18 aircraft AN/APG-65 or AN/APG-73 radar receiver calibration data may be accessed by removing the radar hardware from the aircraft and transporting it to one of the radar benches located at quite a distance from the aircraft's duty station (currently located only in California and Missouri, USA). With the hardware module plugged into the bench a technician can extract calibration data from the hardware and begin to troubleshoot and repair the receiver. The aircraft may be deployed anywhere in the world and the hardware must be transported to one of these radar bench locations. It can take as long as 6 weeks for the hardware to reach the bench, be serviced, and returned to the aircraft wherever it is deployed. During the time the radar hardware is removed from the aircraft it is out of service and unable to perform its mission. Long turn around time on aircraft maintenance can severely influence the success or failure of a mission. Accordingly, a need was identified to extract vital diagnostic data from the radar receiver without removal of the hardware and the sidelining of the aircraft.

An attempt was made to extract the radar calibration data from F/A-18's while stationed on a carrier at sea. A PASS 1000 system was installed in a laptop computer. PASS includes a custom computer card which when installed in a computer creates an interface with the 1553 aircraft bus. A custom program was written to extract data over the interface. A program in C++ language was written to extract and view the radar calibration tables while the hardware remained on the aircraft.

During the one year trial of this system the laptop computer suffered multiple failures due to the environment of a military vessel: moisture, seawater, various contaminants such as fuels and explosives, general rough handling by personnel, and impacts/accidents which were unavoidable during missions. Other shortcomings in a laptop based system were identified. For example, while underway on the deck of the USS Nimitz, the laptop computer failed when it's circuit boards shifted. In addition, the hard drive was compromised when the laptop was dropped on the deck. It was proven difficult to ensure the power supply to the laptop due to personnel neglecting to keep the battery charged and the inability to use regular power cords on the vessel's deck during operations. The length of time it took for the laptop to power up, boot up and extract data was unacceptable in the field. Generally laptop computers are too fragile for operation under bad weather conditions and may have electrical sensitivities. In addition, the C++ program was difficult to understand and manipulate by personnel without a background in computers languages or writing software, thus limiting the program's effectiveness to occasions when personnel with the needed background were available to operate the system. The trial also demonstrated the need for an initial power supply unit (PSU) test of the radar hardware in the case that the hardware did not power up properly.

U.S. Pat. No. 6,219,626B1 issued on Apr. 17, 2001 to Steinmetz, et al. describes a tool for a technician to use in troubleshooting systems on aircraft such as the Apache AH6 helicopter that uses software installed on a laptop that extracts data from the aircraft 1553 bus and allows the technician to refer to a Technical Manual at the same time. This tool is not built to withstand the rigors of military locations and environments. It is restricted to use on one aircraft at a time and the aircraft is grounded for the duration of the use of the tool. The tool is for use by skilled repair technicians. Therefore, this tool does not meet the needs demonstrated above.

Accordingly, there is a need to quickly extract data from multiple radar hardwares and perform power diagnostics under adverse conditions by personnel of varying skills, using a portable device, which is robust and is an efficient use of manpower.

SUMMARY OF THE INVENTION

The present invention relates to a novel diagnostic radar data retrieval apparatus and method of using the same. According to the present invention, a device for extracting data from avionic hardware to a personal computer (PC) for diagnostic purposes includes a means to operate the device, a means to communicate through a bus from avionic hardware to the device, a means to connect a plurality of power supplies to the device, a means to extract data from the avionic hardware and transfer the data to the device, a means to store said extracted data from said avionic hardware to the device in at least one non-volatile memory within the device, a means to perform a test of power supply units (PSUs) within the avionic hardware when the means to extract data from said avionic hardware is unsuccessful, a means to effect the operation of the device, a means to display the operating status of the device, and a means to communicate between the device and a PC.

In accordance with a preferred embodiment of the present invention, the device utilizes a Radar Calibration Collection Module Operating (RCCMOP) system. The device communicates with the avionic hardware through a triax cable connected to a 1553 multiplex bus and through a transceiver within the device. A microcontroller within the device directs extracted data to non-volatile memory (EEPROM) within the device. The device is operated by a push button key pad and includes a Liquid Crystal Display (LCD). The device can perform a PSU test checking power supply units and displaying which power supply unit is faulty on the LCD. The device is coupled to a PC via serial cable and serial ports.

Another embodiment of the present invention includes an operating system program, embodied on a computer readable medium, which operates a device for extracting radar calibration data from at least one aircraft making the data available for troubleshooting and analysis, including a powering up and initiating means for the device, an input means for effecting the operation of the device, an extracting means to obtain the radar calibration data from at least one aircraft and transfer the radar calibration data to the device, a storage means for the extracted radar calibration data within the device, and a communicating means for transferring information between the device and a PC. Preferably the operating system program includes the Radar Calibration Collection Module Operating (RCCMOP) system that receives commands via a push button key pad.

In accordance with another aspect of the present invention, a method for extracting data from avionic hardware via a 1553 bus for diagnostic purposes includes providing a device having a first means for communicating to the 1553 bus, providing an operating system for the device, providing a display means for the status of the device, retrieving the data from the avionic hardware and transferring the data to the device, storing the data in at least one non-volatile memory within the device, providing a data input and display program installed in a PC, and transferring the data to the PC from the device through a second means for communicating between the device and the PC. Preferably the device includes the Radar Calibration Collection Module (RCCM) device and the operating system includes the Radar Calibration Collection Module Operating (RCCMOP) system.

Another embodiment of the present invention includes a method of extracting radar calibration data from a radar system on aircraft making the data available for troubleshooting and analysis includes, connecting a Radar Calibration Collection Module (RCCM) device to the aircraft via a first communication means, connecting a power supply to the RCCM device, performing a full built in test (BIT) of the radar system, thereafter turning off the aircraft's mission computers, operating a Radar Calibration Collection Module Operating (RCCMOP) system program to input the aircraft identifier and download the radar calibration data into the RCCM device, connecting the RCCM device to a PC via a second communication means, executing a data input and display program on the PC, downloading said radar calibration data from the RCCM device to the PC utilizing the data input and display program, and operating the data input and display program to present the radar calibration data in graph or tabular form so that it can be easily used for troubleshooting and analysis in a convenient location. The device can connect to aircraft power or to common 115V/60 Hz power. The preferred input and display program includes WINRCCM. The data input and display program on the PC can upload original and updated versions of RCCMOP to RCCM device. The extraction and storage of data can be repeated for more than one aircraft Another embodiment of the present invention includes a system, embodied on a computer readable medium, of extracting radar calibration data from at least one aircraft making the data available for troubleshooting and analysis includes a means to operate a Radar Calibration Collection Module (RCCM) device, a first means to communicate between the aircraft and the RCCM device, a means to extract said radar calibration data from at least one aircraft and transfer to the RCCM device, a means to store the radar calibration data within the RCCM device, a means to perform a test of power supply units (PSUs) on a radar hardware on said aircraft when the means to extract said radar calibration data from at least one aircraft is unsuccessful, a second means to communicate between the RCCM device and the PC, and a means to direct communication between the RCCM device and the PC wherein the means to direct communication uploads the means to operate the RCCM device to the RCCM device and presents data in formats useful for troubleshooting and analysis.

It is to be understood that the foregoing general description and the following detailed description are exemplary only and are not to be viewed as being restrictive of the present invention as claimed. These and other objects, features and advantages of the present invention will become apparent after a review of the following detailed description of the disclosed embodiments and the appended claims.

DETAILED DESCRIPTION OF THE INVENTION

The present invention relates to a novel diagnostic radar data retrieval apparatus and method of using the same. One aspect of the present invention includes a portable unit (RCCM device) that extracts and stores radar calibration data from radar specific hardware (via a 1553 communications bus) to a personal computer (PC) for diagnostic purposes. Another aspect of the present invention is a method where the calibration data stored in the RCCM device is downloaded to a computer, preferably a PC, with input and display software (preferably WINRCCM software) that receives the data from the RCCM device and processes the radar calibration data into tables for various types of analysis such as, but not limited to, troubleshooting purposes.

Figure 1:
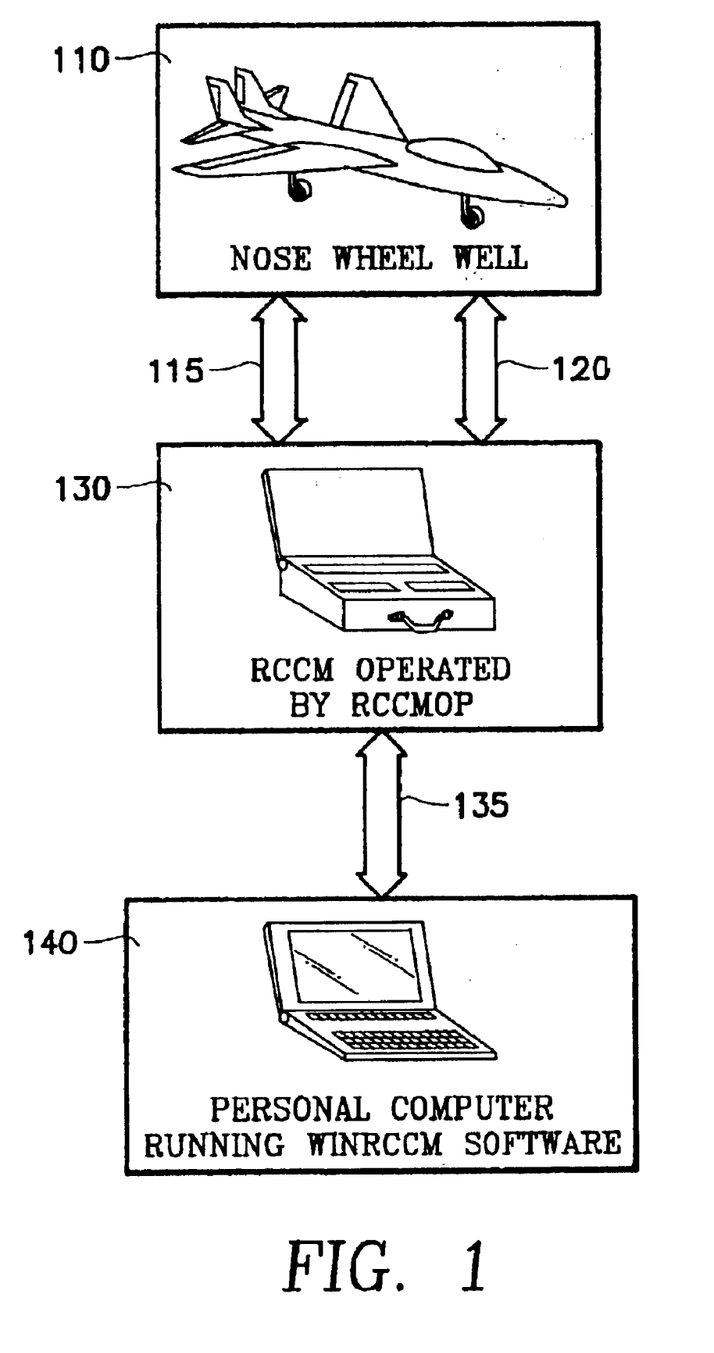
FIG. 1 is a block diagram that illustrates the basic configuration of the diagnostic multi data retrieval apparatus and method of using the same according to a preferred embodiment of the present invention.

FIG. 1 illustrates the overall configuration of a preferred embodiment of the present invention that is an apparatus and a method to extract data from hardware under adverse conditions and make it available to repair personnel without transporting the radar hardware to a repair bench a long distance away. This preferred embodiment of the present invention includes radar hardware inside an aircraft that is connected to the RCCM device 130 via a triax cable 115 connected to the 1553 multiplex bus at the nose wheel well 110. The RCCMOP program is an operating system that runs the RCCM device 130. In another preferred embodiment, the RCCM device 130 is coupled by cable 135 to the serial port (not shown) of the RCCM device to the serial port (not shown) of a personal computer (PC). The PC runs a WINRCCM software 140, that is preferably a windows based input and display program which provides a user friendly interface to download data from the RCCM device 130, presents the data in tables or graphs or other formats that are useful for analysis, and loads the RCCMOP system (or updated versions) into the hardware of the RCCM device 130.

Generally, a personal computer (PC) system includes a bus or other communication mechanism for communicating information, and a processor coupled with the bus for processing information. The PC also includes a main memory such as random access memory (RAM) or other dynamic storage device, coupled to the bus for storing information and instructions to be executed by the processor. Main memory also may be used for storing temporary variable or other intermediate information during execution of instructions to be executed by the processor. The PC further includes a read only memory (ROM) or other static storage device coupled to the bus for storing static information and instructions for processor. A storage device such as a magnetic disk or optical disk, is provided and coupled to the bus for storing information and instructions. The PC may be coupled via the bus to a display, such as a cathode ray tube (CRT), for displaying information to a computer user. An input device, including alphanumeric and other keys, is coupled to the bus for communicating information and command selections to the processor. Another type of input user device is cursor control, such as a mouse, a trackball, or cursor direction keys for communicating direction information and command selections to the processor and for controlling cursor movement on the display.

RCCM

Figure 2A:
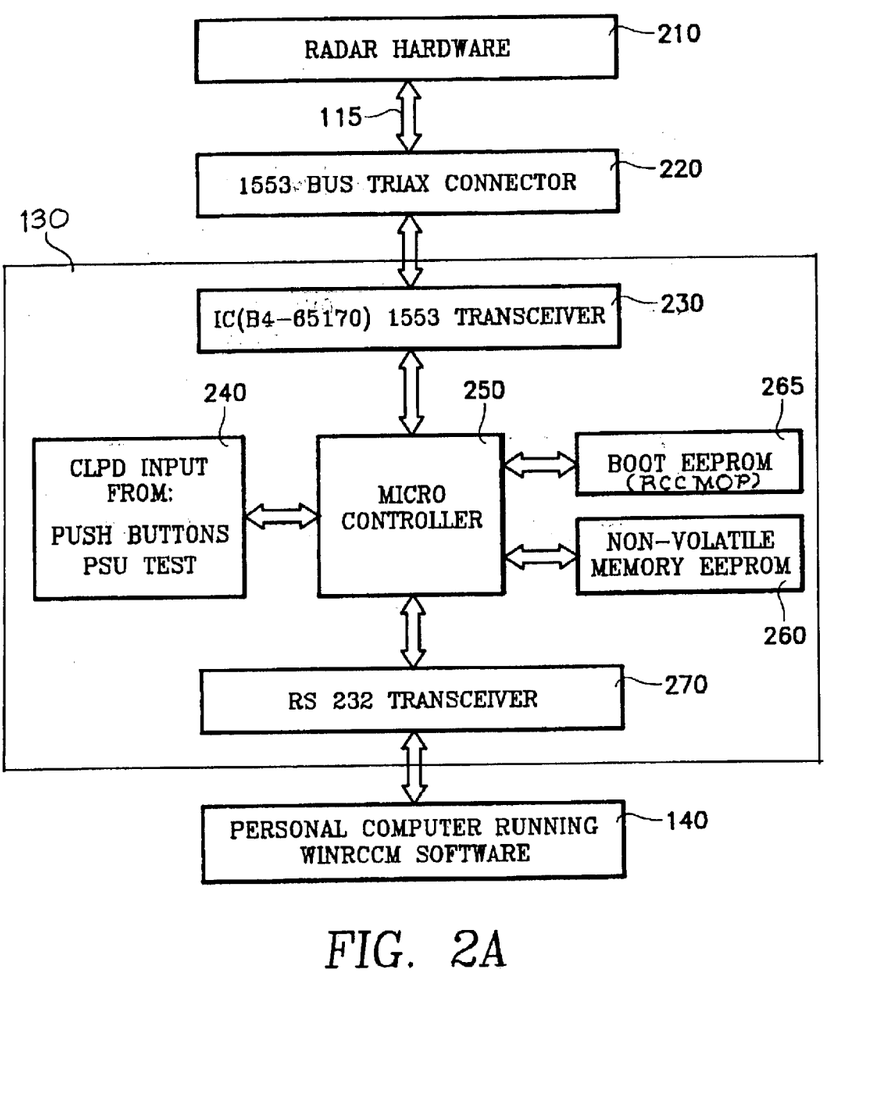
FIG. 2A is a flow chart that illustrates the basic configuration of the Radar Calibration Collection Module (RCCM) device and its internal components showing how data is retrieved and stored according to a preferred embodiment of the present invention.
Figure 2B:
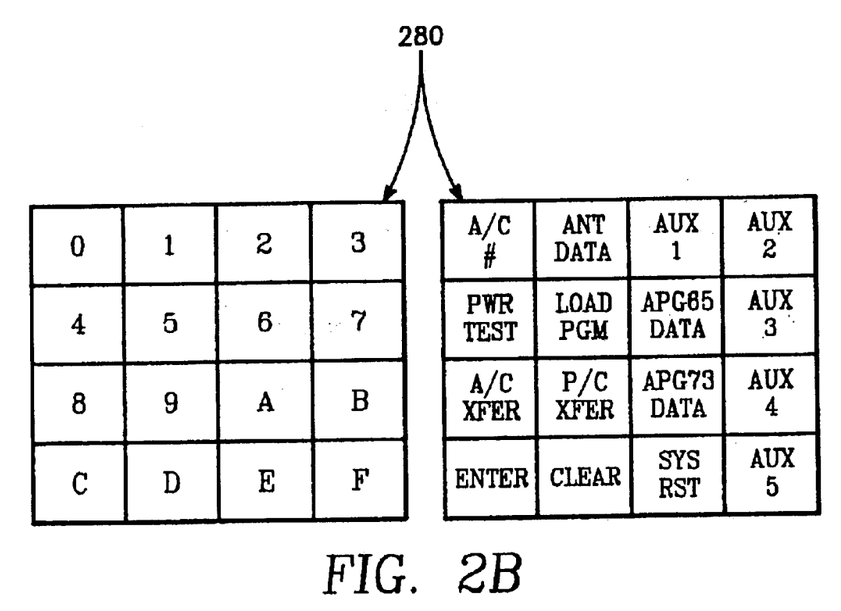
FIG. 2B illustrates a top view of the preferred push button key pads in the RCCM device according to a preferred embodiment of the present invention.

FIGS. 2A–2B show the basic configuration of the internal components of the RCCM device 130 that are housed in a portable, tough, resilient type case built to withstand the rigors of outdoor or indoor use. The RCCM device 130 in a most preferred embodiment of the present invention is a portable unit that extracts radar receiver calibration data from an avionic hardware via a multiplex bus (preferably a 1553 bus) (not shown). The portable RCCM device 130 can use aircraft power or a common 115V/60 Hz external power supply (e.g. a ship's power supply). Data is retrieved from radar hardware 210 from one or more aircraft and stored at once within the RCCM device 130 in at least one non-volatile memory block 260. In addition, the RCCM device can perform a PSU test 240 of the hardware and communicate to personnel via LCD (not shown) the results that indicate which PSU is not operating properly so it may be replaced quickly. FIG. 2B illustrates (a top view) a preferred embodiment of the present invention that shows the push button key pads 280 used by personnel to operate the RCCM device 130 whose major internal components are described in more detail below.

The Complex Programmable Logic Device (CPLD) 240 (in FIG. 2A) receives instructions from specific push button key pad inputs 280 and the results of the PSU test 240 through the military connector 120 (in FIG. 1). Data from the radar hardware 210 passes through the 1553 bus and the triax cable 115 through triax connectors 220 to the 1553 transceiver 230 within the RCCM device 130. A preferred transceiver 230 is, but is not limited to, the DDC BU-65170 manufactured by Summit. The RCCM device 130 communicates with the PC 140 via the serial ports and the transceiver 270. The microcontroller 250 (preferably manufactured by Intel and Motorola) controls, directs and receives all operations of the RCCM device 130 including the key pad inputs 280, the retrieved radar calibration data, the data in storage and the data output to the PC 140. Preferably, radar calibration data is stored in EEPROMs 260 (preferably manufactured by XILINX) which are a non-volatile memory.

RCCMOP

In a preferred embodiment of the present invention, the RCCMOP is embodied on computer readable medium. A computed-readable medium is any article of manufacture that contains data that can be read by a computer. Common forms of computer-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EPROM, any other memory chip or cartridge, or any other medium form which a computer can read. RCCMOP (see FIG. 3A) is written in assembly language (preferably Intel assembly language) and is conveyed to the RCCM device 130 preferably via the WINRCCM software 140 as described below and is stored in a boot EEPROM 265. The microcontroller 250 in the RCCM device effects the operation of the RCCM device 130 by carrying out the RCCMOP program's instructions. In addition to directing the operations of the RCCM device 130, RCCMOP interacts with the push button key pad 280 to perform the required tasks (such as retrieving radar calibration data and storing the data in a memory location as described below).

Figure 3A:
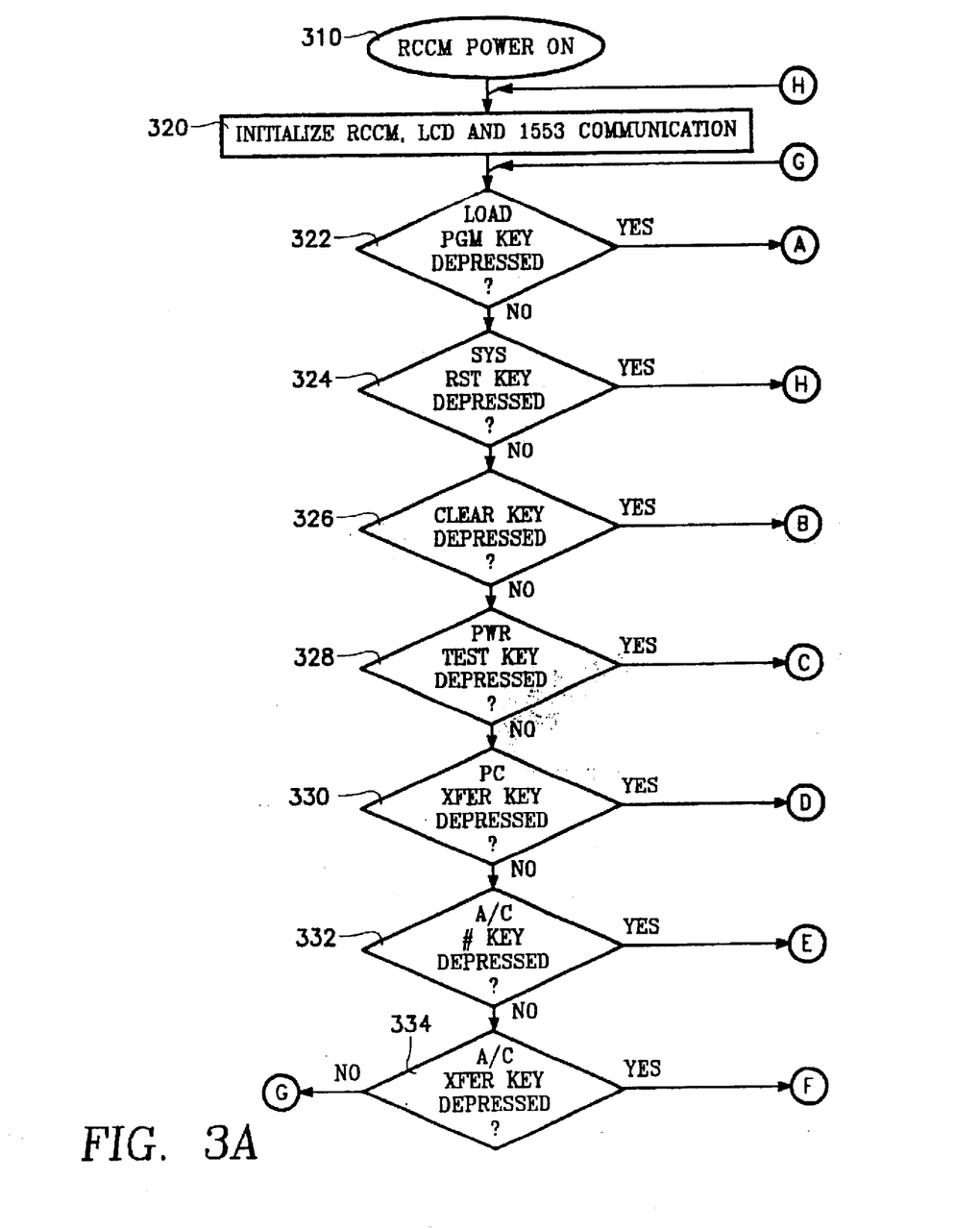
FIG. 3A is a functional flowchart of the operations of the Radar Calibration Collection Module Operating System (RCCMOP) in the RCCM device according to a preferred embodiment of the present invention.
Figure 3B:
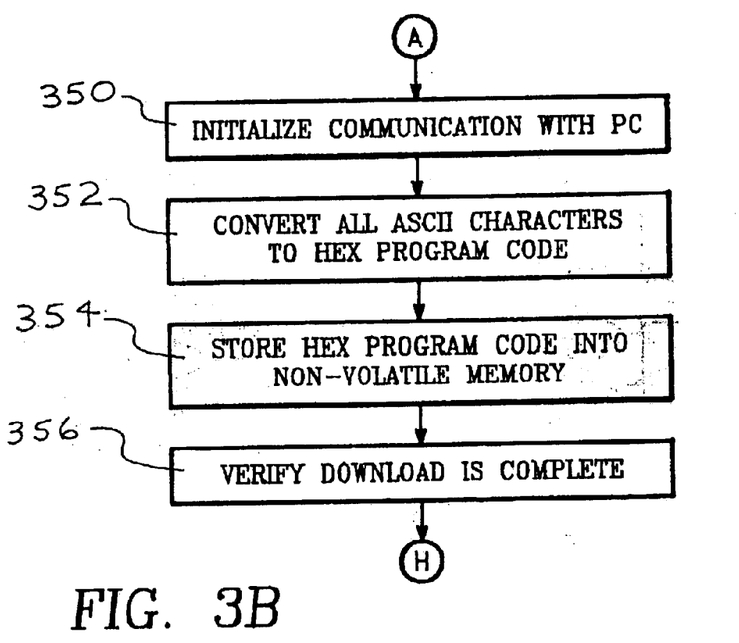
FIGS. 3B, 3C, 3D, 3E, 3F, and 3G are functional flowcharts of the basic functions of the RCCMOP program corresponding to individual push button inputs (shown in FIG. 2B) according to a preferred embodiment of the present invention.
Figure 3C:
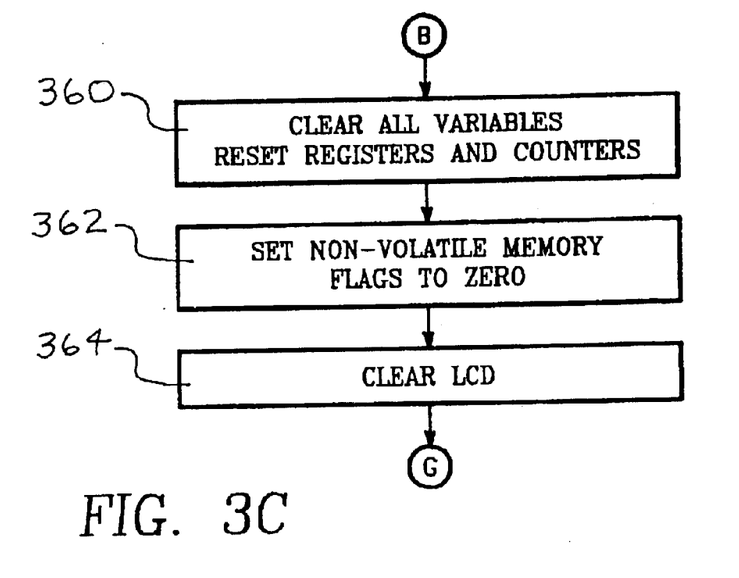
Figure 3D:
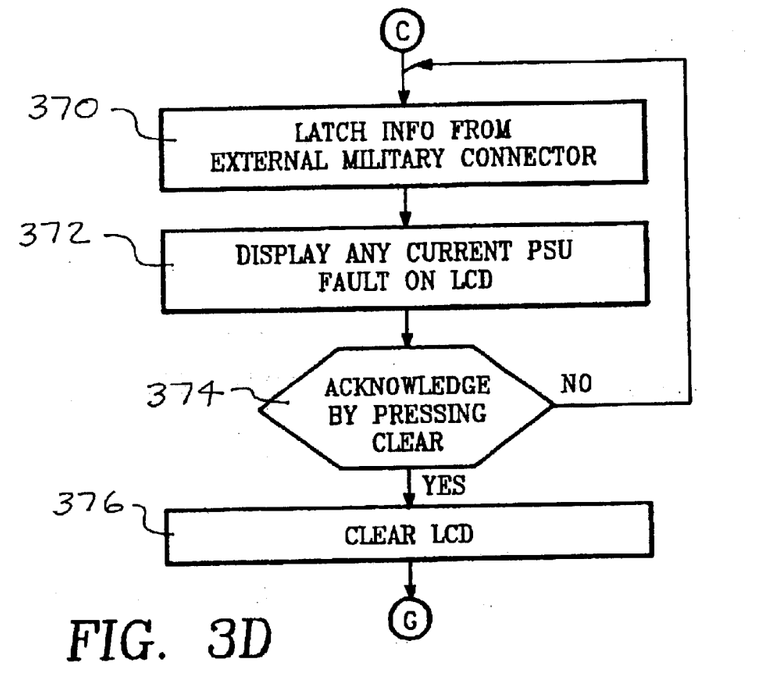
Figure 3E:
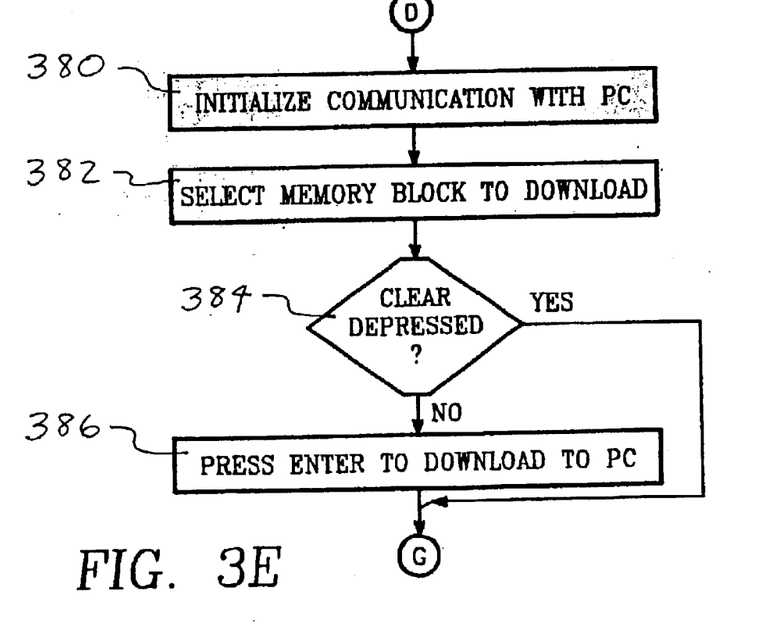
Figure 3F:
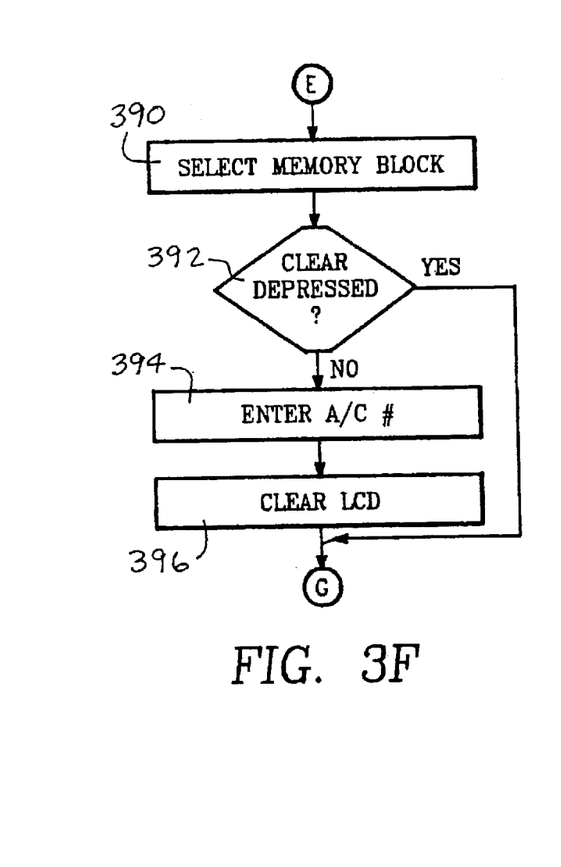
Figure 3G:
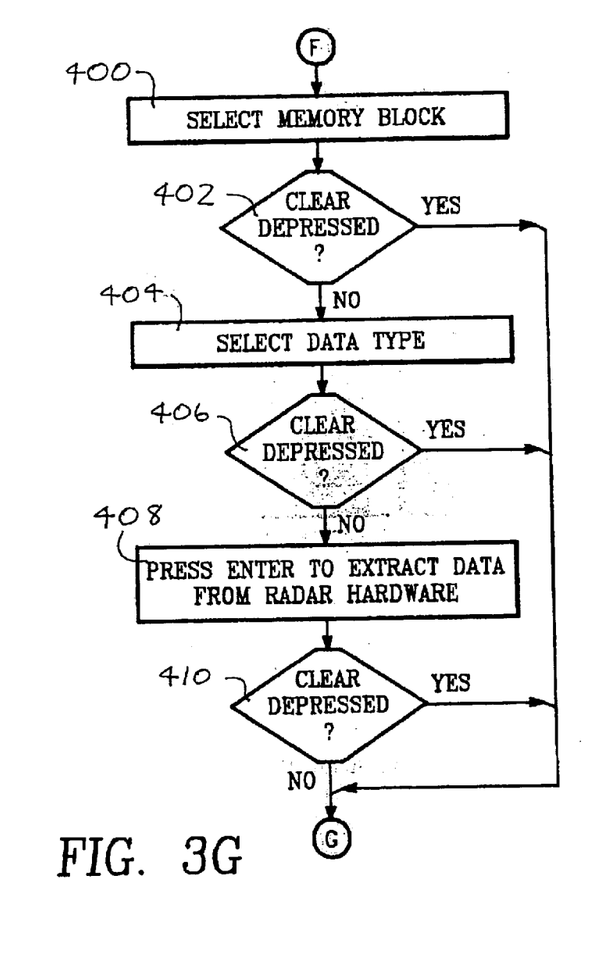

FIG. 3A shows a functional flowchart of the operation of the RCCMOP program. The "yes" and "no" alternatives shown at 322–334 denote whether each push button key was depressed. FIGS. 3A–3G are flowcharts which show the functions associated with each push button key pad 280 command. The RCCM device is turned on 310 and the RCCMOP initializes 320 the RCCM device and awaits the desired push button command.

The following describes the various commands associated with the push button key pad. It is noteworthy that the push button key pad commands can be entered in any order. Those of ordinary skill in the art will readily acknowledge that changes and codifications can be made to the hereinafter described keyboard without departing or diverting from the scope of the present invention.

When the LOAD PGM key is depressed 322 the RCCMOP program or an updated RCCMOP version is obtained from the WINRCCM program on the PC and is downloaded to the internal components of the RCCM device (preferably to the boot EEPROM). The RCCM device is powered up and initializes 320 the RCCM device then the RCCMOP awaits input from the push button key pad 280 as further depicted in FIG. 3B. Communication with the PC is initialized 350, all ASCII characters are converted to HEX program code 352, HEX program code is stored into non-volatile memory 354 and it is verified that the download is complete 356. The RCCM device is initialized again 320.

When the SYS RST key is depressed 324 the RCCMOP system restarts again from the beginning and awaits further input from the push button key. When the CLEAR key is depressed 326 (can be depressed at any time) the RCCMOP abandons its current task and awaits a new input from the push button key pad as further depicted in FIG. 3C. All variables are cleared and registers and counters are reset 360. Non-volatile memory flags are set to zero 362 and the LCD is cleared 364. When the PWR TEST key is depressed 328 the RCCMOP program checks the PSUs on the radar hardware to determine which PSU is faulty and should be replaced as further depicted in FIG. 3D. Information on the status of the PSUs comes in from the external military connector 370, any current PSU fault is displayed on the LCD 372, the results are acknowledged by depressing the CLEAR push button 374 and the LCD is cleared 376. When the PC XFER key is depressed 330 then data is transferred from the RCCM device to the PC for diagnostic purposes in the WINRCCM software. Input from the push button key pad (not shown) determines which memory block RCCMOP downloads to the PC, corresponding to the desired radar calibration data to be examined as further depicted in FIG. 3E. Communication with the PC is initialized 380, the memory block to download is selected 382 via the push button key pad (not shown), there is an ability to press CLEAR if an entry error is made 384, and the download to the PC is started by pressing ENTER 386. When the A/C # key is depressed 332 the memory block and aircraft identifying number is selected by input from the push button key pad 280 as further depicted in FIG. 3F. The desired memory block is selected 390, there is an ability to press CLEAR if an entry error is made 392, the desired A/C # (aircraft identifier number) is entered 394 and the LCD is cleared 396. When the A/C XFER key is depressed 334 the RCCMOP system begins extracting the data from the radar hardware via the 1553 bus. Specific data to be downloaded is selected via input from the push button key pad (not shown) (such as APG 65 or APG 73) and directed to a specified memory block (EEPROM) and the RCCMOP system extracts this data as further depicted in FIG. 3G. The desired memory block is selected 400, there is an ability to press CLEAR if an entry error is made 402, the data type is selected 404, again there is an ability to press CLEAR if an entry error is made 406, ENTER is depressed to extract data from the radar hardware 408, and again there is an ability to press CLEAR if an entry error is made 410.

WINRCCM

In a most preferred embodiment of the present invention, a common commercially available PC runs an input and display program software package WINRCCM written in a programming language such as C++ and Visual Basic. However, a similar program written by those skilled in the art can be utilized by the PC. The WINRCCM program preferably directs communication between the PC 140 and the RCCM device 130 through the serial ports and cable 135 (as depicted in FIG. 1). WINRCCM prompts with the actions the operating personnel must take to extract the data from the non-volatile EEPROM memory of the RCCM device via the serial ports and directs the storage of the radar calibration data into the PC's memory. WINRCCM organizes and displays data in graph or tabular form on the PC making the data easily readable and accessible for diagnostic purposes. These graphs or tables are easily sent to experts at one of the radar bench locations for more in-depth analysis while the aircraft may continue normal operation. Furthermore, the WINRCCM software contains the latest version of the RCCMOP operating system to be uploaded to the RCCM device.

In other embodiments of the present invention the RCCM device can be utilized to extract data from many other avionics systems (such as Forward Looking Infra Red (FLIR)) that support memory inspect functions with only minor changes to the RCCMOP and WINRCCM programs. Utilizing the RCCM Device and the RCCMOP Another aspect of the present invention is the method of extracting radar calibration data from a number of radar hardwares under adverse conditions and making the data available for rapid troubleshooting and analysis. An example of the method includes, but is not limited to, connecting the RCCM device to an aircraft via the nose wheel well connections to the 1553 bus via a triax cable, providing electrical power to the aircraft (aircraft power or normal ship's power), running a full built in test (BIT) of the radar system, turning off the aircraft's mission computers, operating the RCCMOP program to input the aircraft identifier number and the aircraft's radar calibration data into a non-volatile memory block (EEPROM) in the RCCM device, and repeating the process for a number of aircraft. The method also includes: coupling the RCCM device to a PC via a serial cable between the serial ports, and running an input and display program (preferably the WINRCCM software package), uploading any new versions of RCCMOP, downloading data from the RCCM device to the PC and presenting the data in graph or tabular form so that it can be easily used for troubleshooting and analysis by repair personnel in a convenient and safe location. When the BIT of the radar system is not successful the method further includes: selecting the PWR TEST push button on the keypad of the RCCM device, viewing which PSU is at fault on the LCD, and taking action to replace or repair the PSU.

Although the description above contains much specificity, this should not be construed as limiting the scope of the invention but as merely providing an illustration of the presently preferred embodiment of the invention. Thus the scope of this invention should be determined by the appended claims and their legal equivalents.

What is claimed is:

1. A device for extracting data from avionic hardware to a personal computer (PC) for diagnostic purposes comprising:

means to operate said device;

means to communicate through a bus from said avionic hardware to said device;

means to connect to a plurality of power supplies to said device;

means to extract data from said avionic hardware and transfer said data to said device;

means to store said extracted data from said avionic hardware to said device, said data stored in at least one non-volatile memory within said device;

means to perform a test of power supply units (PSUs) within said avionic hardware when said means to extract data from said avionic hardware is unsuccessful;

means to effect the operation of said device;

means to display operating status of said device; and means to communicate between said device and said PC.

2. The device of claim 1 wherein said means to operate said device is a Radar Calibration Collection Module Operating (RCCMOP) system.

3. The device of claim 1 wherein said avionic hardware is radar hardware.

4. The device of claim 1 wherein said bus from said avionic hardware to said device is a 1553 multiplex bus.

5. The device of claim 1 wherein said means to communicate through a bus to said avionic hardware is a triax cable connected to a 1553 multiplex bus.

6. The device of claim 1 wherein said means to extract data from said avionic hardware and transfer said data to said device is a transceiver.

7. The device of claim 1 wherein said means to perform a test of said power supply units within said avionics hardware when said means to extract data from said avionic hardware is unsuccessful is a PSU test performed by said means to operate said device wherein said PSU test checks said power supply units and displays which power supply unit is faulty on said means to display operating status of said device.

8. The device of claim 1 wherein said means to effect the operation of said device is at least one push button key pad.

9. The device of claim 1 wherein said means to display operating status of said device is an LCD.

10. The device of claim 1 wherein said means to communicate between said device and said PC includes coupling said device and said PC together via a serial cable wherein said device includes a first serial port and said PC includes a second serial port and said cable connects said first and second serial ports.

11. The device of claim 1 wherein said means to store said extracted data from said hardware, said data stored in at least one non-volatile memory includes a microcontroller receiving said extracted data through a transceiver, said microcontroller directing said extracted data to said at least one non-volatile memory within said device.

12. The device of claim 11 wherein said at least one non-volatile memory further comprises an EEPROM.

13. An operating system program, embodied on a computer readable medium, to operate a device for extracting radar calibration data from at least one aircraft making the data available for troubleshooting and analysis, comprising:

a Radar Calibration Collection Module Operating (RCCMOP) system comprising:

powering up and initiating means within said device;

input means for effecting the operation of said device;

extracting means to obtain said radar calibration data from said at least one each aircraft and transfer said radar calibration data to said device;

storage means for said extracted radar calibration data within said device; and communicating means for transferring information between said device and a personal computer (PC).

14. An operating system program of claim 13 wherein said powering up and initiating means within said device includes a microcontroller controlling the internal components of said device.

15. An operating system program of claim 13 wherein said input means for effecting the operation of said device is at least one push button key pad.

16. An operating system program of claim 13 wherein said extracting means to obtain said radar calibration data from said at least one aircraft and transfer said radar calibration data to said device is a triax cable connecting a 1553 bus on said at least one aircraft and a transceiver within said device.

17. An operating system program of claim 13 wherein said communicating means for transferring information between said device and said PC includes coupling said device and said PC together via a serial cable wherein said device includes a first serial port and said PC includes a second serial port and said cable connects said first and second serial ports.

18. An operating system program of claim 13 wherein said storage means for said extracted radar calibration data within said device is at least one non-volatile memory.

19. The operating system program of claim 18 wherein the at least one non-volatile memory further comprises an EEPROM.

20. A method for extracting data from avionic hardware via a 1553 bus for diagnostic purposes comprising:

providing a device having a first means for communicating to said 1553 bus;

providing an operating system for said device, said operating system being a Radar Calibration Collection Module Operating (RCCMOP) system;

providing a display means for the status of said device;

retrieving said data from said avionic hardware and transferring said data to said device;

storing said data in at least one non-volatile memory within said device;

providing a data input and display program installed in a personal computer (PC); and transferring said data to said PC from said device through a second means for communicating between said device and said PC.

21. The method of claim 20 wherein said device is a Radar Calibration Collection Module (RCCM) device.

22. The method of claim 20 wherein said avionic hardware is radar hardware.

23. The method of claim 20 wherein said first communicating means is a triax cable connected to said 1553 bus.

24. The method of claim 20 wherein said display means for the status of said device is a LCD on said device.

25. The method of claim 20 wherein said data is retrieved from said avionic hardware and transferred to said device via a triax cable connecting said 1553 bus and a transceiver within said device.

26. The method of claim 20 wherein said at least one non-volatile memory within said device is an EEPROM.

27. The method of claim 20 wherein said second communicating means includes coupling said device and said PC together via a serial cable wherein said device includes a first serial port and said PC includes a second serial port and said cable connects said first and second serial ports.

28. A method of extracting radar calibration data from a radar system on aircraft making the data available for troubleshooting and analysis, comprising:

connecting a Radar Calibration Collection Module (RCCM) device to said aircraft via a first communication means;

connecting a power supply to said RCCM device;

performing a full built in test (BIT) of said radar system;

thereafter, turning off the aircraft's mission computers;

operating a Radar Calibration Collection Module Operating (RCCMOP) system program to input the aircraft identifier and download said radar calibration data into said RCCM device;

connecting said RCCM device to a personal computer (PC) via a second communication means;

executing a data input and display program on said PC;

downloading said radar calibration data from said RCCM device to said PC utilizing said data input and display program; and operating said data input and display program to present said radar calibration data in graph or tabular form so that it can be easily used for troubleshooting and analysis in a convenient location.

29. The method of claim 28 wherein said first communicating means is a triax cable connected to a 1553 bus on said aircraft.

30. The method of claim 28 wherein said power supply is aircraft power.

31. The method of claim 28 wherein said power supply is common 115V/60 Hz power.

32. The method of claim 28 wherein said second communicating means includes coupling said device and said PC together via a serial cable wherein said RCCM device includes a first serial port and said PC includes a second serial port and said cable connects said first and second serial ports.

33. The method of claim 28 wherein said data input and display program on said PC uploads original and updated versions of said RCCMOP to said RCCM device.

34. The method of claim 28 wherein said data input and display program on said PC is WINRCCM.

35. The method of claim 28 wherein said method of extracting radar calibration data is repeated for more than one aircraft.

36. The method of claim 28 wherein when said BIT of said radar system is not successful performing a test of power supply units (PSUs) within said radar system, viewing results of said test on a LCD on said RCCM device, listing the PSUs which are faulty, and repairing said faulty PSUs.

37. The method of claim 28 wherein said radar calibration data is downloaded into a non-volatile memory in said RCCM device.

38. The method of claim 37 wherein the non-volatile memory block further comprises an EEPROM.

39. A system, embodied on a computer readable medium, of extracting radar calibration data from at least one aircraft making the data available for troubleshooting and analysis, comprising:

means to operate a Radar Calibration Collection Module (RCCM) device;

first means to communicate between said aircraft and said RCCM device;

means to extract said radar calibration data from said at least one aircraft and transfer to said RCCM device;

means to store said radar calibration data within said RCCM device; means to perform a test of power supply units (PSUs) on a radar hardware on said aircraft when said means to extract said radar calibration data from said at least one aircraft is unsuccessful;

second means to communicate between said RCCM device and said personal computer (PC); and means to direct communication between said RCCM device and said PC wherein said means to direct communication uploads said means to operate said RCCM device to said RCCM device and presents data in formats useful for troubleshooting and analysis.

40. The system of claim 39 wherein said first means to communicate between said aircraft and said RCCM device is a triax cable connected to a 1553 bus on said aircraft.

41. The system of claim 39 wherein said means to extract said radar calibration data to said RCCM device is a transceiver within said RCCM device.

42. The system of claim 39 wherein said means to perform a test of said power supply units within said radar hardware on said aircraft is a PSU test performed by said means to operate a RCCM device wherein said PSU test checks said power supply units and displays which power supply unit is faulty on a LCD on said RCCM device.

43. The system of claim 39 wherein said second mean to communicate includes coupling said RCCM device and said PC together via a serial cable wherein said RCCM device includes a first serial port and said PC includes a second serial port and said cable connects said first and second serial ports.

44. The system of claim 39 wherein said means to operate said RCCM device is a Radar Calibration Collection Module Operating (RCCMOP) system.

45. The system of claim 44 wherein said RCCMOP system is directed by push button key pad commands.

46. The system of claim 39 wherein said means to store radar calibration data from said aircraft within said RCCM device include includes a microcontroller receiving said radar calibration data through a transceiver, said microcontroller directing said extracted data to at least one non-volatile memory.

47. The system of claim 46 wherein the at least one non-volatile memory further comprises an EEPROM.

48. The system of claim 39 wherein the means to direct communication between said RCCM device and said PC is an input and display program.

49. The system of claim 48 wherein said input and display program is WINRCCM.

* * * * *